United States Patent [19]

Cameron

[11] Patent Number: 5,099,482
[45] Date of Patent: Mar. 24, 1992

[54] APPARATUS FOR DETECTING UNCORRECTABLE ERROR PATTERNS WHEN USING EUCLID'S ALGORITHM TO DECODE REED-SOLOMON (BCH) CODES

[75] Inventor: Kelly Cameron, Moscow, Id.

[73] Assignee: Idaho Research Foundation, Inc., Moscow, Id.

[21] Appl. No.: 400,447

[22] Filed: Aug. 30, 1989

[51] Int. Cl.$^5$ ............................................. G06F 11/10
[52] U.S. Cl. .................................................. 371/37.1
[58] Field of Search ..................... 371/37.1, 38.1, 39.1, 371/40.1

[56] References Cited

U.S. PATENT DOCUMENTS

| 4,833,678 | 5/1989 | Cohen | 371/37.1 |
| 4,841,300 | 6/1989 | Yoshida | 371/37.1 X |
| 4,866,716 | 9/1989 | Weng | 371/37.1 |
| 4,868,828 | 9/1989 | Shao | 371/39.1 X |
| 4,873,688 | 10/1989 | Maki | 371/37.1 |

Primary Examiner—Robert W. Beausoliel
Attorney, Agent, or Firm—Limbach & Limbach

[57] ABSTRACT

A Reed-Solomon Galois Field Euclid algorithm decoder determines whether an error is uncorrectable by checking for:
I. deg $[\Lambda(x))] \leq t$
II. deg $[\Omega(x)] < \deg[\Lambda(x)]$
III. All roots of $\Lambda(x)$ are in $GF(q^m)$
IV. Roots of $\Lambda(x)$ are distinct
V. $\Lambda(x)$ has no roots at 0
VI. $S(x)\Lambda(x) \equiv \Omega(x) \mod x^{2t}$ An error in a received Reed Solomon message may be uncorrectable. An error is correctable only when each of the six conditions are met. Any error which fails to meet these six criteria cannot be corrected It is important to users of such encoded data that they are aware that an error is contained therein which is uncorrectable. Because it has only recently been proven that failure to meet these criteria in fact is the result of an uncorrectable error. No prior art Reed Solomon decoder checks to determine whether these criteria are in fact met. Many of these criteria are checked by implication as the normal result of calculating through Euclid's algorithm.

3 Claims, 4 Drawing Sheets 5,099,482

APPARATUS FOR DETECTING UNCORRECTABLE ERROR PATTERNS WHEN USING EUCLID'S ALGORITHM TO DECODE REED-SOLOMON (BCH) CODES

FIELD OF THE INVENTION

This invention relates to the field of Reed-Solomon decoders. More particularly, this invention relates to an apparatus for determining whether a received message that has been Reed-Solomon encoded is correctable by Euclid's algorithm.

BACKGROUND OF THE INVENTION

A variety of algorithms have been developed to decode Reed-Solomon codes. A typical decoding procedure consists of the following steps:
1. Computation of the Syndrome Polynomial.
2. Determination of the Error Locator Polynomial, $\Lambda(x)$, and the Error Magnitude Polynomial, $\Omega(x)$.
3. Calculation of the Error Magnitudes and Error Locations.
4. Substraction of the Errors from the received message if correctable.

A Reed-Solomon Code is defined in terms of its generator polynomial, $G(x)$:

$$G(x) = \prod_{i=0}^{2t-1} (x - \beta^{i+m_0}) \tag{1}$$

where $m_0$ is an integer, and $\beta$ is a field element in $GF(q^m)$. $t$ is the designed symbol error correcting capacity of the code. While the selection of $m_0$ is completely arbitrary, $\beta$ must be chosen such that the factors of $G(x)$ do not form a subfield in $GF(q^m)$. In other words, if $\beta = \alpha^\varsigma$, where $\alpha$ is a primitive element in $GF(q^m)$ and $\varsigma$ is an integer, then $\varsigma$ must not contain factors in common with $q^m - 1$.

The coding process may be viewed as any method of taking a sequence of $\kappa$ message symbols, represented as the coefficients of an order $\kappa - 1$ polynomial, and appending $2t$ redundancy symbols to create a code block, $C(x)$. The redundancy symbols are chosen such that the roots of $C(x)$ include the roots of $G(x)$. Mathematically, this may be described as follows:

$$C(x) = x^{2t}M(x) + R_{G(x)}[x^{2t}M(x)] = A(x)G(x) \tag{2}$$

It should be noted here that the above relationships portray the construction of a systematic code. Any invertible transformation that maps $M(x)$ into $C(x)$ such the $G(x)$ divides $C(x)$ can be viewed as an encoding transformation. The process of corrupting the original code block, $C(x)$, with errors may be viewed as adding an error polynomial, $E(x)$, to $C(x)$. The resultant, corrupted polynomial is known as the received polynomial, $R(x)$:

$$R(x) = C(x) + E(x) = A(x)G(x) + E(x) \tag{3}$$

The $\nu$ non-zero terms of the error polynomial contain all the information necessary to completely reconstruct the original $C(x)$, since each term corresponds to a symbol error location and magnitude:

$$E(x) = \sum_{k=1}^{\nu} e_{j_k} x^{j_k} \tag{4}$$

where $j_k$ is the location of the $\kappa^{th}$ error and $e_{j_k}$ is the magnitude of the error. The complete syndrome polynomial, $S(x)$, is obtained by evaluating the error polynomial, $E(x)$, at all field elements, starting with the roots of $G(x)$:

$$S(x) = \sum_{i=0}^{\infty} x^i E(z) \Big|_{z=\beta^{i+m_0}} \tag{5}$$

$S(x)$ may be viewed as a transform of $E(x)$ into the frequency domain. $S(x)$ completely determines $E(x)$. From Equation 3 it can be seen that the first $2t$ terms of $S(x)$ may be determined by evaluating the received polynomial, $R(x)$, at the roots of $G(x)$:

$$S(x) = \sum_{i=0}^{2t-1} x^i R(z) \Big|_{z=\beta^{i+m_0}} \bmod x^{2t} \tag{6}$$

where the mod $x^{2t}$ indicates that only the first $2t$ terms of $S(x)$ are correctly predicted by this expression. It is also easily shown that if $E(x)$ contains $\nu$ non-zero terms, that $S(x)$ may be written:

$$S(x) = \sum_{k=1}^{\nu} \frac{e_{j_k} \beta^{m_0 j_k}}{1 - x\beta^{j_k}} \tag{7}$$

where all quantities are as defined for Equation 4. Retaining only the first $2t$ terms and combining with Equation 6:

$$S(x) = \sum_{k=1}^{\nu} \frac{e_{j_k} \beta^{m_0 j_k}}{1 - x\beta^{j_k}} \bmod x^{2t} \tag{8}$$

Hence, all syndrome polynomials, $S(x)$, which can be written in the above form with some $\nu \leq t$ correspond to correctable error patterns. Those which cannot be so expressed correspond to uncorrectable error patterns.

FIG. 1 shows a graphical way of considering this problem. For a given Galois Field, the circles 22A through 22F represent the domains of correctable errors for the properly encoded polynomials 20A through 20F. If the correctly transmitted polynomial 20C is received as 20C, there is no error to be corrected. If R(X)1 is received, the error is properly correctable to 20C. If R(X)2 is received, the error is improperly correctable to 20A. If R(X)3 is received, the error is uncorrectable.

If an error is uncorrectable it is desireable for the user to know that the data is corrupted and cannot be corrected. However, no Reed-Solomon decoder has been designed which determines whether the received polynomial is correctable.

SUMMARY OF THE INVENTION

The present invention is for a Reed-Solomon Galois Field error correction apparatus which utilizes Euclid's Algorithm. The apparatus checks for each of the 6 correctable error pattern requirements. Five of the requirements are automatically checked as artifacts of using Euclid's recursive algorithm and doing the Chien search. The sixth requirement is checked with special purpose hardware designed for this function.

A seventh requirement may be imposed for shortened codes. A shortened code is a code which does not utilize all of the available binary counting numbers for a given code length. Thus, if an error is indicated for one of the unused binary counting numbers, that polynomial is uncorrectable.

DETAILED DESCRIPTION OF THE PREFERRED EMBODIMENT

Correctable Error Pattern Requirements

Figure 1:
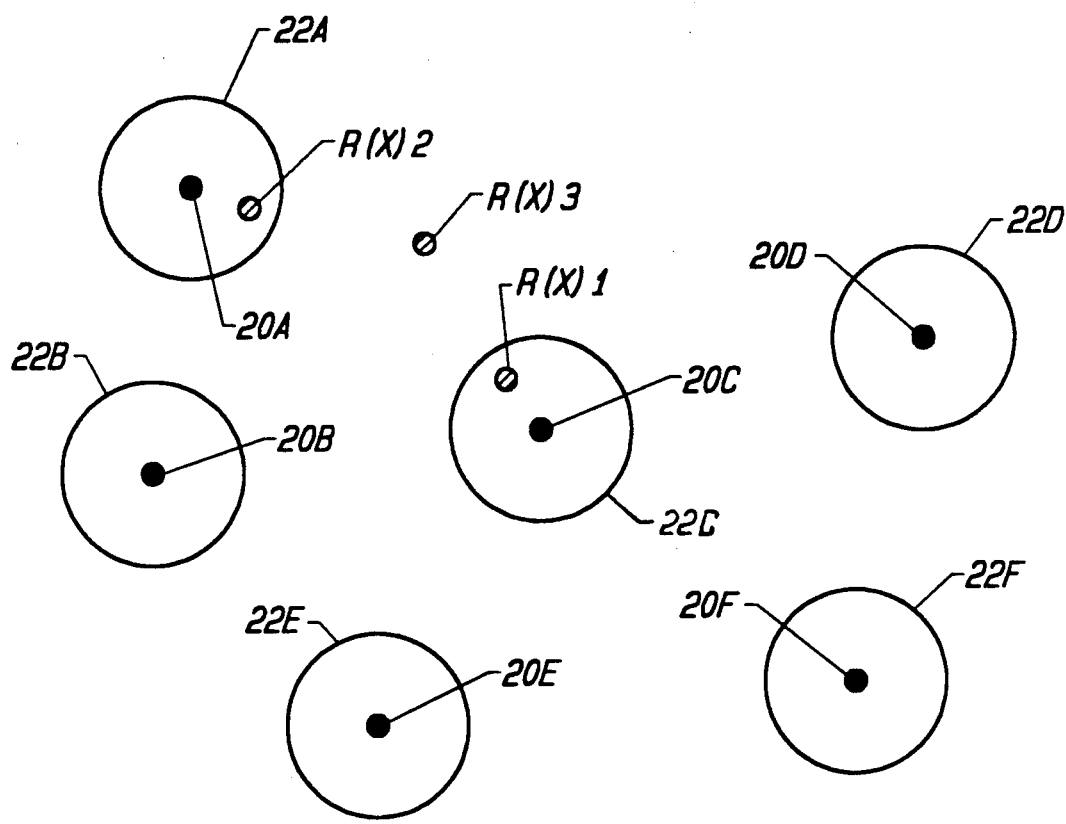
FIG. 1 shows a schematic representation of a transmitted message and an uncorrectable error.

Three polynomials, $\Lambda(x)$ (also known as the Error Locator Polynomial), $\Omega(x)$ (the Error Magnitude Polynomial), and $S(x)$ (the Syndrome Polynomial) are necessary to correct a received polynomial $R(x)$. For an error to be correctable these polynomils should have the following properties:

note: $\deg[\ldots] \equiv$ Degree of $[\ldots]$

I. $\deg[\Lambda(x)] \leq t$
II. $\deg[\Omega(x)] < \deg[\Lambda(x)]$
III. All roots of $\Lambda(x)$ are in $GF(q^m)$
IV. Roots of $\Lambda(x)$ are distinct
V. $\Lambda(x)$ has no roots at 0
VI. $S(x)\Lambda(x) \equiv \Omega(x) \bmod x^{2t}$ It will be shown, by the mathematical proof below, that these properties imply that $S(x)$ may be expressed in the form which implies a correctable error pattern (Equation 8). Multiplying and dividing by $\Lambda(x)$:

$$S(x)\Lambda(x) = \frac{\Lambda(x)\Omega(x)}{\Lambda(x)} \bmod x^{2t} \tag{9}$$

From Property II, it follows that $\Omega(x)/\Lambda(x)$ may be written as a partial fraction expansion. Property IV insures that each term of the expansion can be written as a constant divided by a linear term:

$$\frac{\Omega(x)}{\Lambda(x)} = \sum_{i=1}^{N} \frac{\gamma_i}{x - a_i} \tag{10}$$

where $N = \deg[\Lambda(x)]$. Properties III and V insure that both $\alpha_i$ and $\gamma_i$ are in $GF(q^m)$. The $l^{th}$ coefficient, $\gamma_l$, may be determined by multiplying Equation 10 by $(x - \alpha_l)$ and invoking L'Hopital's Rule to evaluate the resulting expression at $x = \alpha_l$:

$$\frac{(x - a_1)\Omega(x)}{\Lambda(x)}\bigg|_{x=a_1} = \sum_{i=1}^{N} \frac{\gamma_i}{x - a_1}(x - a)_1 \bigg|_{x=a_1} \tag{11}$$

$$\frac{\frac{d}{dx}[(x - a_1)\Omega(x)]}{\frac{d}{dx}\Lambda(x)}\bigg|_{x=a_1} = \frac{\Omega(x)}{\Lambda'(x)}\bigg|_{x=a_1} = \gamma_1 \tag{12}$$

Therefore, combining Equations 10 and 12, it can be seen that Equation 9 may be rewritten:

$$\frac{\Omega(x)}{\Lambda(x)} = \sum_{i=1}^{N} \frac{1}{x - a_1} \frac{\Omega(z)}{\Lambda'(z)}\bigg|_{x=a_1} \tag{13}$$

and:

$$S(x)\Lambda(x) = \Lambda(x) \sum_{i=1}^{N} \frac{1}{x - a_1} \frac{\Omega(z)}{\Lambda'(z)}\bigg|_{x=a_1} \bmod x^{2t} \tag{14}$$

Furthermore, there exists a polynomial, $f(x)$, having $\deg[f(x)] < q^m - 2t$, such that:

$$S(x)\Lambda(x) = \Lambda(x) \sum_{i=1}^{N} \frac{1}{x - a_1} \frac{\Omega(z)}{\Lambda'(z)}\bigg|_{x=a_1} + f(x)x^{2t} \tag{15}$$

But since $\Lambda(x)$ and $x^{2t}$ have no factors in common, it follows that $\Lambda(x)$ must be a factor of $f(x)$. That is, $a(x)\Lambda(x) = f(x)$.

$$S(x)\Lambda(x) = \Lambda(x) \sum_{i=1}^{N} \frac{1}{x - a_1} \frac{\Omega(z)}{\Lambda'(z)}\bigg|_{x=a_1} + a(x)\Lambda(x)x^{2t} \tag{16}$$

Dividing by $\Lambda(x)$ and retaining only the first $2t$ terms:

$$S(x) = \sum_{i=1}^{N} \frac{1}{x - a_1} \frac{\Omega(z)}{\Lambda'(z)}\bigg|_{x=a_1} \bmod x^{2t} \tag{17}$$

If $N \leq t$ it follows from Equation 17 that $S(x)$ may be written in the form required (Equation 8) for a correctable error pattern when Properties I through VI are satisfied. This then implies that the satisfaction of these Properties is sufficient to insure that $S(x)$ corresponds to a correctable error pattern.

An additional constraint VII is necessary for shortened codes. All roots of the received polynomial must correspond to symbol positions that are actually sent. An error in a "virtual symbol" location cannot actually be introduced by the channel; therefore, such an occurrence indicates that more than $t$ errors have occurred.

Euclid's Algorithm

Euclid's algorithm is a recursive algorithm for solving for the error locator polynomial, $\Lambda(x)$, and the error magnitude polynomial, $\Omega(x)$. It is based on Euclid's algorithm for finding the greatest common divisor. The recursive relationships are:

$$\Omega(x)^{(i)} = -q_i(x)\Omega(x)^{(i-1)} + \Omega(x)^{(i-2)} \tag{18}$$

$$\Lambda(x)^{(i)} = \Lambda(x)^{(i-2)} - q_i(x)\Lambda(x)^{(i-1)} \tag{19}$$

where: $\Lambda_{-1} = 0$, $\Lambda_0 = 1$, $\Omega_{-1} = x^{2t}$, and $\Omega_0 = S(x)$. The algorithm terminates when $\deg[\Omega(x)] < t$.

At each step in the iteration, $\Lambda_i$ and $\Omega_i$ satisfy the key equation (Property VI). At every step, $\deg[\Lambda(x)]$ increases while $\deg[\Omega(x)]$ decreases. The termination condition given is proper when the associated syndrome polynomial, $S(x)$, corresponds to a correctable error pattern. Nothing is said about the behavior of the algorithm when the error is uncorrectable. When an uncorrectable pattern is encountered, however, one or more of the properties listed in the previous section must be violated, since it was shown that they form a set of conditions which imply the error pattern is correctable.

Due to the nature of the algorithm itself, it is easily shown that all solutions obtained satisfy Properties I and VI, irrespective of the error pattern. All others may or may not be satisfied. Properties III, IV, V and VII are easily checked when $\Lambda(x)$ is solved for its roots (usually using a Chien search). If only those field elements, corresponding to potential error positions are searched, the number of roots found should equal the degree of $\Lambda(x)$. Property II, $\deg[\Omega(x)] < \deg[\Lambda(x)]$ MUST be explicitly checked when using Euclid's algorithm. The fact that it may be violated by the results obtained from the algorithm is best shown by example:

Uncorrectable Condition

As noted above, successive solutions of the key equation (Property VI), $S(x)\Lambda(x) \equiv \Omega(x) \mod x^{2t}$, are obtained at each step of the iteration. The conditions necessary for Property II to be violated while decoding an arbitrary double error correcting code will be derived, to show that the event can occur.

The key equation may also be represented as two equivalent (though normalized) systems of linear equations—one of which is solved for $\Lambda(x)$, while the other yields $\Omega(x)$. For the first iteration of the algorithm:

$$[s_3 \ s_2]\begin{bmatrix} 1 \\ l_1 \end{bmatrix} = [0] \text{ and } \begin{bmatrix} s_2 & s_1 \\ s_1 & s_0 \\ s_0 & 0 \end{bmatrix}\begin{bmatrix} 1 \\ l_1 \end{bmatrix} = \begin{bmatrix} \Omega_2 \\ \Omega_1 \\ \Omega_0 \end{bmatrix} \quad (20)$$

where $s_i$ is a coefficient of $S(x)$, $\Omega^i$ is a coefficient of $\Omega(x)$ and $l_1$ is the degree 1 coefficient of $\Lambda(x)$. (It is assumed here that the equations are normalized such the $l_0 = 1$.) Solving these equations for $\Omega_2 = 0$ and $\Omega_1 \neq 0$ yields the conditions which must hold for the algorithm to halt with $\deg[\Lambda(x)] = \deg[\Omega(x)] = 1$. This clearly violates the requirement that $\Omega(x)$ be of lower degree than $\Lambda(x)$. Necessary and sufficient conditions for this to occur are:

$$s_3 = \frac{s_2^2}{s_1} \text{ and } s_2 \neq \frac{s_1^2}{s_0} \quad (21)$$

which is clearly possible since all $S(x)$ do occur. (The proof follows directly from Equation 6.) Actually performing Euclid's algorithm symbolically for this case yields:

$$\Lambda_1(x) = -\frac{s_1}{s_2^2} x + \frac{s_1^2}{s_2^3} \quad (22)$$

$$\Omega_1(x) = \left(\frac{s_1^3}{s_2^3} - \frac{s_0 s_1}{s_2^2}\right) x + \frac{s_0 s_1^2}{s_2^3} \quad (23)$$

which is consistent.

Properties I, III, IV, V and VI are checked as an artifact of correcting errors. Property II has never been checked heretofore.

Figure 2:
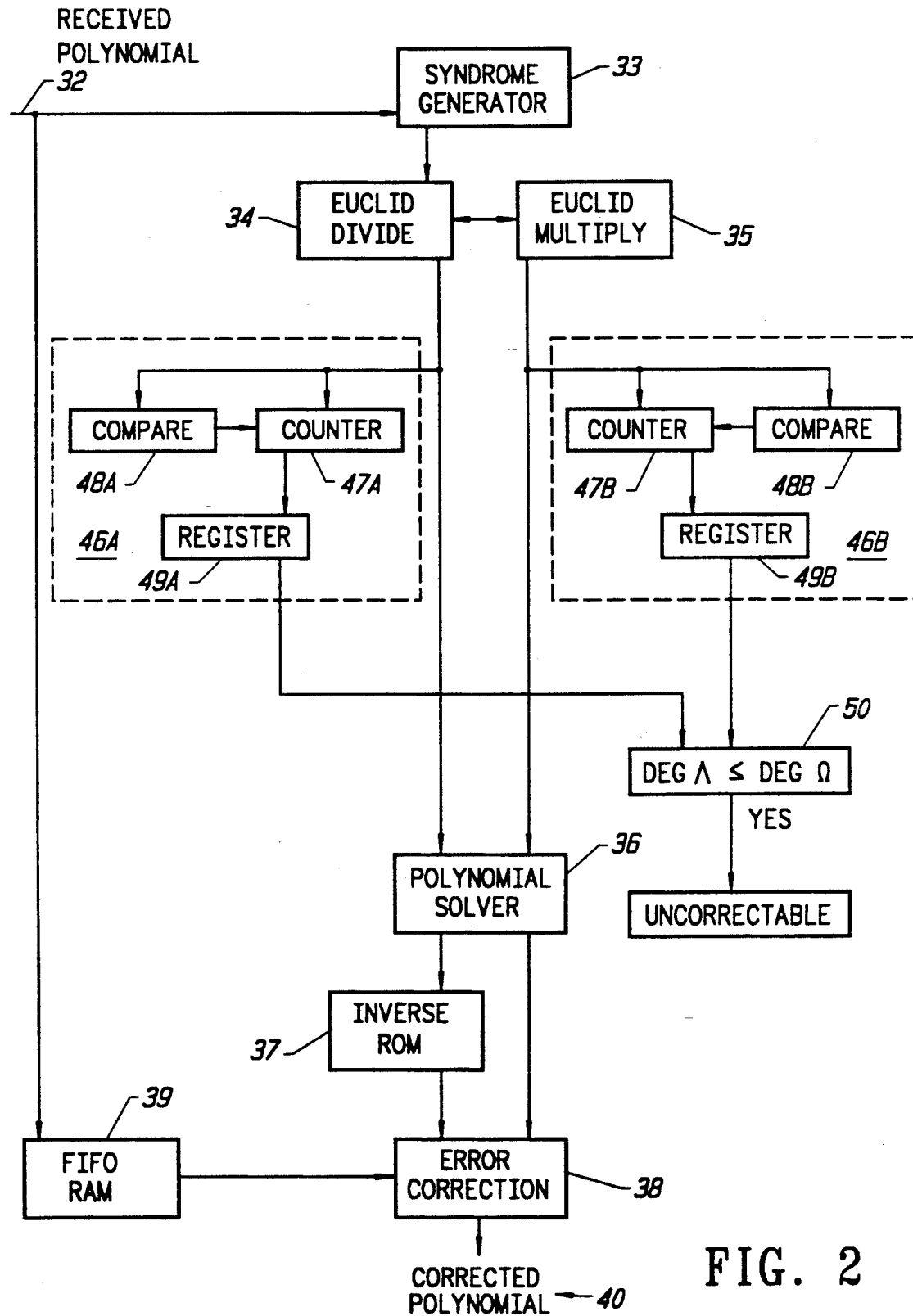
FIG. 2 shows a block diagram of the preferred embodiment of the present invention.

FIG. 2 shows a Reed-Solomon Galois Field decoder which corrects errors using Euclid's algorithm. For a detailed description for the operation of the remainder of this circuit see U.S. patent application No. 105, 401.

A received polynomial 32 is coupled to a syndrome generator 33. The syndrome generator 33 calculates each of the 2t syndromes for the given received polynomial 32. The syndrome generator 33 is coupled to a Euclid divide module 34. The Euclid divide module 34 is coupled to the Euclid multiply module 35. The syndromes are input into the Euclid divide module 34 from the syndrome generator 33. The Euclid divide module 34 generates the magnitude polynomial. A quotient developed by the Euclid divide module 34 is utilized by the Euclid multiply module 35 to develop the location polynomial.

The Euclid divide module 34 and Euclid multiply module 35 are coupled to the polynomial solver 36. The magnitude polynomial and the location polynomial are input to the polynomial solver. The polynomial calculates the first derivative of the location polynomial. The polynomial solver 35 also finds the zeros of the location polynomial. The polynomial solver 36 is coupled to the inverse ROM 37 and the error correction module 38. The inverse ROM, 37 is programmed with the inverse, i.e. $1/x$, for the elements of the particular Galois Field. The inverse ROM is used to find the inverse of the first derivative of the location polynomial. The polynomial solver 36 also supplies th magnitude polynomial and the location of the zeros of the location polynomial.

The received polynomial 32 is also coupled to a FIFO RAM 39. The FIFO RAM 39 is sufficiently large to hold four polynomials. The received polynomial is passed from the FIFO RAM 39 into the error correction unit 38 to be corrected by the magnitude polynomial, location polynomial and the inverse of the first derivative of the location polynomial. Once the received polynomial 32 has been corrected, the corrected polynomial 40 is output from the error corrections decoder for use in an another circuit.

Additionally, this circuit contains a degree $\Omega(x)$ module 46A. This circuit monitors the $\Omega(x)$ polynomial as it is communicated from the Euclid divide module 34 to the polynomial solver 36. Each coefficient is transferred, one coefficient at a time from the Euclid divide module 34 to the polynomial solver 36, from the lowest order coefficient to the highest. A counter 47A is incremented for each coefficient. Each coefficient is compared by comparator 48A to determine if is non-zero. Under the control of the comparator 48A, the value in the counter is entered into a degree of $\Omega(x)$ register 49A for each non-zero coefficient of $\Omega(x)$.

The analogous hardware is present for determining the degree of $\Lambda(x)$. That hardware contains a counter 47B, comparator 48B and degree of $\Lambda(x)$ register 49B.

The value stored in the degree of $\Lambda(x)$ register 49B is compared in comparator 50 to the value stored in the degree of $\Omega(x)$ register 49B. If degree $\Lambda(x)$ is less than or equal to degree of $\Omega(x)$ register 49A the error is uncorrectable.

Figure 3:
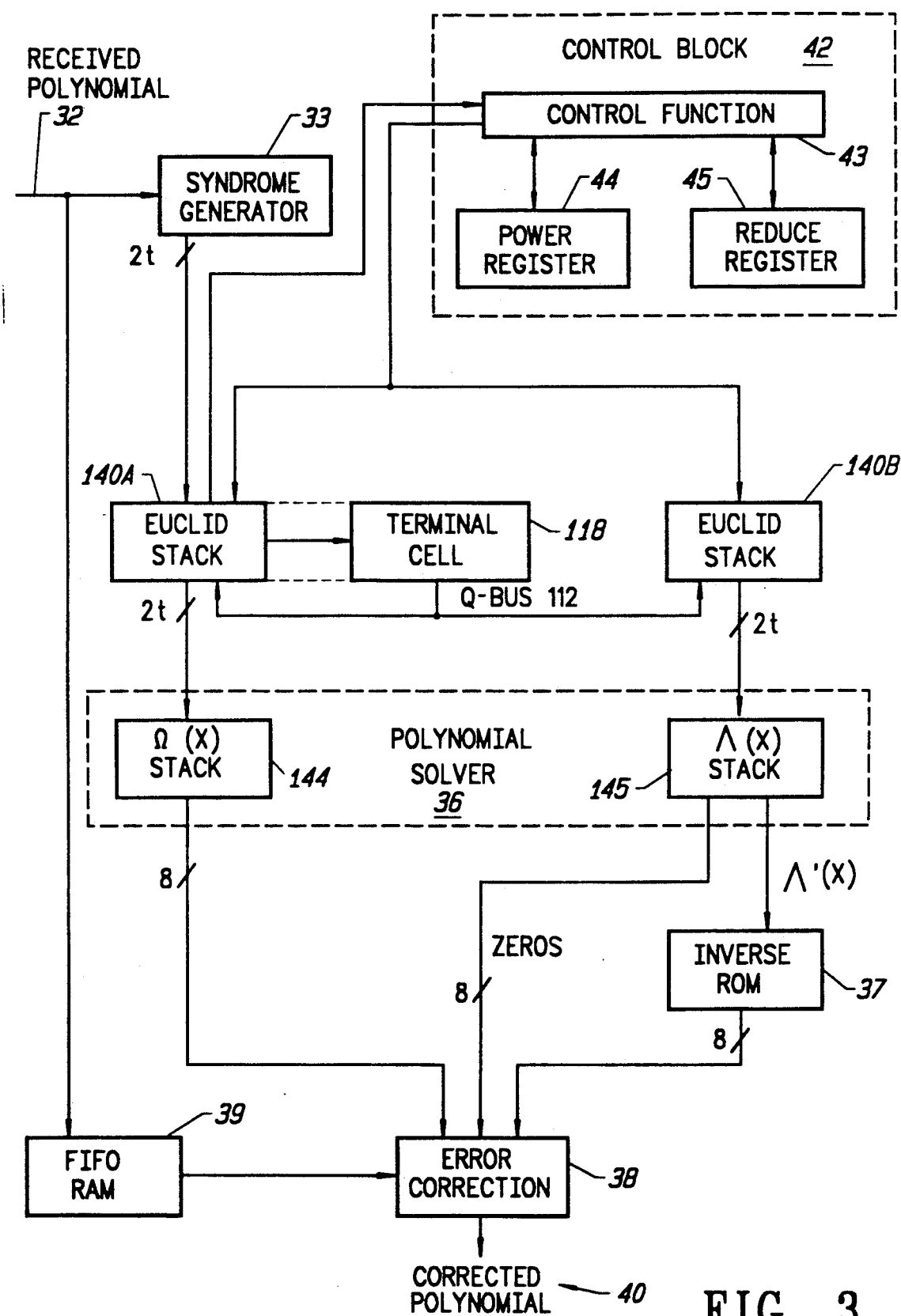
FIG. 3 shows a block diagram of a first alternate embodiment of the present invention.

FIG. 3 shows an alternate embodiment of a Reed-Solomon Galois Field decoder which corrects errors using Euclid's algorithm. For a detailed description for the operation of the remainder of this circuit see U.S. patent application No. 400,739 (filed herewith).

The two devices are similar except that the Euclid divide module 34 in FIG. 2 has been replaced by a Euclid stack module 140A in FIG. 3 Similarly, the Euclid multiply module 35 in FIG. 2 has been replace by a Euclid stack module 140B which has the same architecture as the Euclid stack module 140A. The received polynomial 32 is coupled to the syndrome generator 33. The syndrome generator 33 calculates each of the 2t syndromes for the given received polynomial 32. The syndrome generator 33 is coupled to a first Euclid stack module 140A. The Euclid stack module 140A is coupled to receive control signals from the control block 42. The control block 42 contains a control function module 43 which receives a signal from the first Euclid stack module 140A. The control function module 43 is bidirectionally coupled to a POWER register 44 and a REDUCE register 45 which will be described below in relation to the control sequences.

The syndromes are input into the Euclid stack module 140A from the syndrome generator 33. The syndromes for T(x) are developed by the syndrome generator 33. The Euclid stack module 140 generates the T(x) polynomial. Once the T(x) polynomial has been formed each element of the polynomial is in its correct location in the Euclid stack module 140 to commence the $\Omega(x)$ recursion and solve the $\Omega(x)$ polynomial in the $\Omega(x)$ stack 144 of the polynomial solver 36 to determine to magnitude of the errors.

Similarly, a second Euclid stack 140B is coupled to receive control signals from the control block 42. The two Euclid stack 140A and 140B can be identical. A terminal cell 118 is coupled to receive a control signal from the first Euclid stack 140A. Based upon the control signal, the terminal cell 118 places an appropriate signal onto the Q-bus 112. The Q-bus 112 is coupled to each of the two Euclid stacks 140A and 140B.

The second Euclid stack receives the initial condition of a 1 as an initial condition for forming $\Gamma(x)$. After $\Gamma(x)$ is formed it is used to commence the $\Lambda(x)$ recursion and then solve the $\Lambda(x)$ polynomial in the $\Lambda(x)$ stack 145 of the polynomial solver 36.

By having the initial conditions of $\Gamma(x)$ and T(x) this decoder is able to resolve twice as many erasure errors as a decoder having initial conditions of 1 and S(x).

The $\Lambda(x)$ stack 145 solves for zeros of the $\Lambda(x)$ polynomial and finds the first derivative of the $\Lambda(x)$ polynomial. $\Lambda'x$ is provided to an inverse ROM 37. The magnitude, zeros, and inverse first derivative of $\Lambda'(x)$ are provided to the error correction module 38 of the decoder. This information is compared to the received polynomial 32 which has been stored in the FIFO RAM 39 to form a corrected polynomial 40.

This error correction decoder operates in a four deep pipeline. The error correction module 38 can be acting upon a first message. The polynomial solver 36 can be acting upon a second message. The Euclid stack module 41 operates upon a third message. The syndrome generator 33 can operate upon a fourth message. The FIFO RAM 39 stores the same four polynomials being acted upon as just described. The initial conditions 42 supplied to the Euclid stack modules 140A or 140B determine which procedure is currently being resolved.

The POWER register 44 contains the degree of the $\Lambda(x)$ polynomial. The $\Omega(x)$ of polynomial is shifted by the value contained in the POWER register 44. The highest order coefficient is shifted out first. If any non-zero coefficients are shifted out of $\Omega(x)$ polynomial then the degree of the $\Omega(x)$ polynomial must be higher than the degree of th $\Lambda(x)$ polynomial. In that case the error is uncorrectable.

Figure 4:
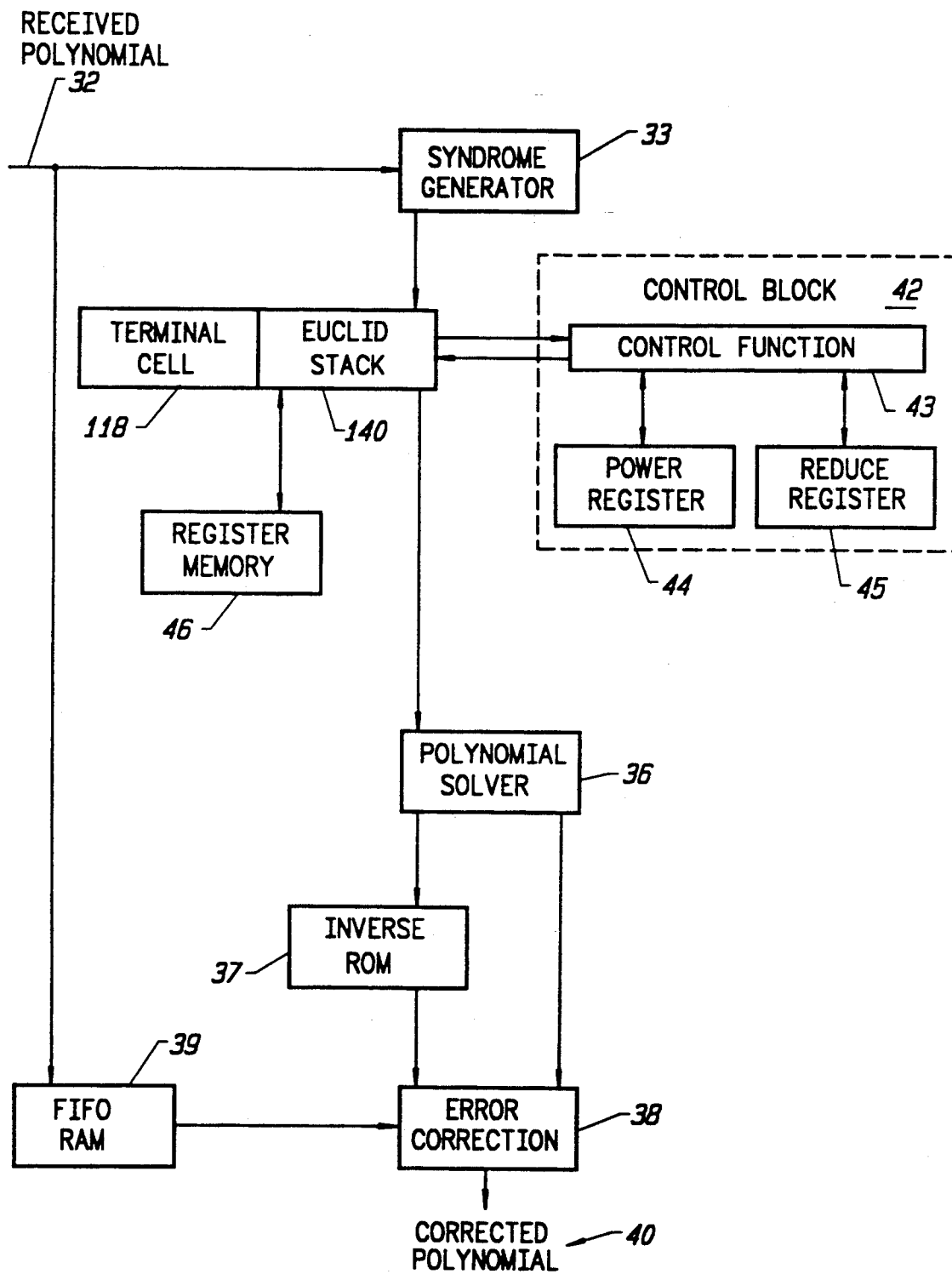
FIG. 4 shows a block diagram of a second alternate embodiment of the present invention.

FIG. 4 shows another alternate embodiment of a Reed-Solomon Galois Field decoder which corrects errors using Euclid's algorithm. For a detailed description for the operation of the remainder of this circuit see U.S. patent application No. 400,739 (filed herewith).

The two devices are similar except that the Euclid stack module 140A and the Euclid stack module 140B have been combined into a single Euclid stack module 140. The various modules developed by the two stack modules 140A and 140B are developed by the single stack module 140 which multiplexes between forming the polynomials.

What is claimed is:

1. A method for determining whether an error in a received Reed-Solomon encoded message is correctable using Euclid's algorithm for forming a magnitude polynomial and a location polynomial comprising the steps of:
   A. determining a degree of the magnitude polynomial;
   B. determining a degree of the location polynomial;
   C. comparing the two polynomials to determine whether the degree of the location polynomial is greater than the degree of the magnitude polynomial; and
   D. either correcting the error if the degree of the location polynomial is greater than the degree of the magnitude polynomial or indicating that the error cannot be corrected if the degree of the location polynomial is less than or equal to the degree of the magnitude polynomial.

2. A Read-Solomon Galois Field Euclid Algorithm decoder which solves for an error in a received message comprising:
   a) means for receiving the message;
   b) means for calculating a magnitude polynomial, deg[$\Omega(x)$], representing a portion of a magnitude of said error in the message coupled to the means for receiving;
   c) means for calculating a location polynomial, deg[$\Lambda(x)$], representing a location of said error in said received message said location polynomial having a first derivative polynomial coupled to the means for receiving;
   d) means for determining whether deg[$\Omega(x)$]<deg[$\Lambda(x)$]; and
   e) alternative means for either correcting the error if deg[$\Omega(x)$]<deg[$\Lambda(x)$] or for indicating the error cannot be corrected if deg[$\Omega(x)$]$\geq$deg[$\Lambda(x)$].

3. The apparatus according to claim 2 wherein the means for determining comprises means for determining degree of the magnitude polynomial and means for determining the degree of the location polynomial and means for comparing those degrees.

* * * * *

UNITED STATES PATENT AND TRADEMARK OFFICE
CERTIFICATE OF CORRECTION

PATENT NO. : 5,099,482
DATED : March 24, 1992
INVENTOR(S) : Kelly Cameron

It is certified that error appears in the above-identified patent and that said Letters Patent is hereby corrected as shown below:

On the Title page in the Abstract reference block [57], Line 5, I., delete "$[\Lambda(x))] \leq t$" and replace with --$[\Lambda(x)] \leq t$--.

On the Title page in the Abstract reference block [57], Line 10, VI., delete "$S(x)\Lambda(x) = \equiv \Omega(x) \mod x2t$" and replace with --$S(x)\Lambda(x) \equiv \Omega(x) \mod x2t$--.

On the Title page in the Abstract, Line 14 insert --.-- after "corrected".

In Column 1, Line 25 delete "Substraction" and replace with --Subtraction--.

In Column 2, Lines 1-5, Equation (4), delete $$E(x) = \sum_{k=1}^{\nu} e_{jk} \, x^{jk}$$

and replace with $$E(x) = \sum_{k=1}^{\nu} e_{j_k} \, x^{j_k}$$

UNITED STATES PATENT AND TRADEMARK OFFICE
CERTIFICATE OF CORRECTION

PATENT NO. : 5,099,482

DATED : March 24, 1992

INVENTOR(S) : Kelly Cameron

It is certified that error appears in the above-identified patent and that said Letters Patent is hereby corrected as shown below:

In Column 2, Lines 35-38, Equation (7), delete $$S(x) = \sum_{k=1}^{\nu} \frac{e_{jk}\beta^{m0jk}}{1 - x\beta^{jk}}$$

and replace with $$S(x) = \sum^{\nu} \frac{e_{jk}\beta^{m}0^{j}k}{1 - x\beta^{j}k}$$

In Column 2, Lines 44-46, Equation (8), delete $$S(x) = \sum_{k=1}^{\nu} \frac{e_{jk}\beta^{m0jk}}{1 - x\beta^{jk}} \mod x^{2t}$$

and replace with $$S(x) = \sum_{k=1}^{\nu} \frac{e_{jk}\beta^{m}0^{j}k}{1 - x\beta^{j}k} \mod x^{2t}$$

UNITED STATES PATENT AND TRADEMARK OFFICE
CERTIFICATE OF CORRECTION

PATENT NO.  : 5,099,482

DATED       : March 24, 1992

INVENTOR(S) : Kelly Cameron

It is certified that error appears in the above-identified patent and that said Letters Patent is hereby corrected as shown below:

In Column 3, Line 37 delete "polynomils" and replace with --polynomials--.

In Column 6, Line 39 delete "th" and replace with --the--.

In Column 6, Line 59 insert --it-- before "is non-zero".

In Column 7, Line 11 delete "replace" and replace with --replaced--.

In Column 8, Line 10 delete "th" and replace with --the--.

In Column 8, Line 43 delete "Read" and replace with --Reed--.

Signed and Sealed this

Nineteenth Day of October, 1993

Attest:

BRUCE LEHMAN

*Attesting Officer*         *Commissioner of Patents and Trademarks*